(12) United States Patent
Bolden, II et al.

(10) Patent No.: US 8,333,166 B2
(45) Date of Patent: Dec. 18, 2012

(54) PLASMA TREATMENT SYSTEMS AND METHODS FOR UNIFORMLY DISTRIBUTING RADIOFREQUENCY POWER BETWEEN MULTIPLE ELECTRODES

(75) Inventors: Thomas V. Bolden, II, Fremont, CA (US); Elmer M. Calica, Antioch, CA (US); Robert S. Condrashoff, Concord, CA (US); Louis Fierro, Clearwater, FL (US); James D. Getty, Vacaville, CA (US)

(73) Assignee: Nordson Corporation, Westlake, OH (US)

( * ) Notice: Subject to any disclaimer, the term of this patent is extended or adjusted under 35 U.S.C. 154(b) by 44 days.

(21) Appl. No.: 13/100,605

(22) Filed: May 4, 2011

(65) Prior Publication Data

US 2012/0279658 A1 Nov. 8, 2012

(51) Int. Cl.
| | |
|---|---|
| *C23C 16/00* | (2006.01) |
| *C23F 1/00* | (2006.01) |
| *H01L 21/306* | (2006.01) |
| *H01J 7/24* | (2006.01) |
| *H05B 31/26* | (2006.01) |

(52) U.S. Cl. ........... 118/723 E; 156/345.44; 315/111.21

(58) Field of Classification Search .................. 118/715, 118/722, 723 R, 723 E; 156/345.43–345.47; 315/111.21
See application file for complete search history.

(56) References Cited

U.S. PATENT DOCUMENTS

| | | | |
|---|---|---|---|
| 8,018,163 B2 * | 9/2011 | Wi | 315/111.21 |
| 2002/0000201 A1 * | 1/2002 | Murata et al. | 118/723 E |
| 2006/0163201 A1 | 7/2006 | Getty et al. | |
| 2009/0288773 A1 | 11/2009 | Bolden, II et al. | |

* cited by examiner

*Primary Examiner* — Maureen Gramaglia
(74) *Attorney, Agent, or Firm* — Wood, Herron & Evans, LLP

(57) ABSTRACT

Plasma treatment systems and methods for distributing RF energy to electrodes in a plasma treatment system. The plasma treatment system includes power and ground busses, positive and negative phase primary electrode busses, and positive and negative phase secondary electrode busses. The power and ground busses are coupled to the secondary electrode busses by isolation transformers so that the negative phase secondary electrode buss is provided with an RF signal that is 180 degrees out of phase with the RF signal supplied to the positive phase secondary electrode buss. The secondary electrode busses are coupled to respective positive and negative phase primary electrode busses by capacitors. The primary electrode busses are each coupled to electrodes in the vacuum chamber. Load coils coupling the primary electrode busses to an RF ground may cooperative with the capacitors to adjust the input impedance at the power buss.

11 Claims, 11 Drawing Sheets

PLASMA TREATMENT SYSTEMS AND METHODS FOR UNIFORMLY DISTRIBUTING RADIOFREQUENCY POWER BETWEEN MULTIPLE ELECTRODES

TECHNICAL FIELD

The invention relates generally to plasma processing and, in particular, to plasma treatment systems configured to distribute radio frequency (RF) power to multiple electrodes and methods for providing RF power to multiple electrodes in a plasma treatment system.

BACKGROUND

Plasma treatments are frequently used to deposit thin films on and modify the surface properties of substrates used in a variety of applications including, but not limited to, integrated circuits, electronic packages, printed circuit boards, and medical devices. In particular, plasma treatment systems may be used to deposit various types of thin film materials onto substrates, such as optical and bio-medical coatings, insulating layers, polymers, and the like. Plasma treatment may also be used to prepare semiconductor and circuit board surfaces for electronics packaging. For example, plasma treatments may be used to etch resin and/or photoresist, to remove drill smear, to increase surface activation and/or surface cleanliness for eliminating delamination and bond failures, to improve wire bond strength, to ensure void free underfilling of chips attached to printed circuit boards, to remove oxides from surfaces, to enhance die attach, and to improve adhesion for chip encapsulation.

In a conventional plasma processing system, multiple substrates are placed inside a vacuum chamber between one or more pairs of electrodes. The vacuum chamber is then evacuated and filled with a partial pressure of a processing gas. Once the chamber atmosphere has the desired processing gas composition and pressure, energy is introduced into the chamber by exciting the one or more electrode pairs so that an electromagnetic field is generated between the electrodes. Each electrode pair is excited with a signal having sufficient energy to produce an electromagnetic field that at least partially ionizes the process gases, thereby generating a plasma. If an etching process is to be performed, the processing gasses and energy levels are adjusted so that the kinetic and chemical properties of the plasma result in the outermost surface layer (s) of atoms being removed from each substrate by physical sputtering, chemically-assisted sputtering, and chemical reactions promoted by the plasma. The physical or chemical action may be used to condition the surface to improve properties such as adhesion, to selectively remove an extraneous surface layer, or to clean undesired contaminants from the substrate's surface.

Plasma assisted film deposition methods typically operate by either chemical vapor deposition (CVD) or polymerization. If a CVD process is to be performed, the processing gas will include at least one precursor of the material being deposited. The precursor molecules are decomposed by the plasma formation process and the resulting precursor ions condense and react on the substrate surface to form a thin layer of the desired material. In some CVD applications, the substrate may also be heated to facilitate the deposition of the thin film material. If a polymerization process is to be performed, the process gas will include one or more monomer molecules. The monomer molecules are decomposed in the process of forming the plasma, forming ionized molecules that combine—or polymerize—as they condense on the substrate. The plasma initiated reaction of monomer molecules may thereby form a thin layer of polymer chains and/or three-dimensional networks on the substrate surface. Both the CVD and polymer processes may be used to produce thin conformal coatings on a wide variety of products.

Plasma processing systems including multiple electrode pairs allow both sides of multiple panels to be treated simultaneously in a batch process, which improves production throughput. To this end, a substrate holder locates each panel with a vertical orientation between pairs of planar vertical electrodes arranged in a rack, so that the environment between each planar vertical electrode and the adjacent surface of the panel provides a local process chamber in which the partially ionized processing gas—or plasma—is present. To generate the plasma, the electrode pair is energized by a power source with a suitable atmosphere present in the treatment chamber of the plasma processing system. Plasma processing systems employ power sources producing signals at various frequencies, with two commonly used frequencies being 40 kHz and 13.56 MHz. The frequency used to generate the plasma may affect both the chemistry of the plasma and how the plasma interacts with the substrate being treated. Deposition rates, as well as the quality and type of films deposited on the substrate may therefore vary with the frequency and intensity of the signal used to excite the plasma. For polymer film depositions, plasmas generated with higher frequency signals have typically been found to result in plasmas with improved chemistry that result in higher deposition rates and better quality films.

The panels processed in multiple electrode plasma processing systems may be quite large. For example, the panels may have a rectangular perimeter that is characterized by a width of about 26 inches and a length of about 32 inches. Electrodes must have an area at least as large as the panels being treated and the electrode rack may include a dozen or more electrodes spaced apart horizontally. The overall dimensions of the electrode rack may therefore be on the order of two to three feet in each dimension, thus requiring an equally large electrode excitation signal distribution system. As the dimensions of the electrodes and electrode racks increase, maintaining field strength uniformity across the entire surface area of each treated substrate as well as between substrates becomes more challenging. The problem of maintaining plasma uniformity may be exacerbated at higher electrode excitation frequencies because the dimensions of the electrodes and the excitation signal distribution system become a larger fraction of the excitation signal wavelength. Conventional RF bussing systems that achieve sufficient field uniformity at 40 kHz provide insufficient uniformity in multiple electrode plasma systems operating at higher plasma excitation frequencies such as 13.56 MHz. In addition, the input impedances of conventional RF bussing systems are difficult to match at these higher frequencies, resulting in high standing wave ratios and wasted RF power.

Therefore, there is a need for plasma treatment systems and methods to more uniformly distribute RF power to multiple electrodes in a plasma treatment system with improved input impedances at higher operating frequencies, such as 13.56 MHz.

SUMMARY

In one embodiment, a plasma treatment system includes power and ground busses, positive phase and negative phase secondary electrode busses, positive phase and negative phase primary electrode busses, a plurality of isolation transformers, a capacitors coupling the positive phase secondary electrode buss to the positive phase primary electrode buss and additional capacitors coupling the negative phase secondary electrode buss to the negative phase primary electrode buss. Each of the isolation transformers includes a primary winding primary winding having a first end coupled to the power buss and a second end coupled to the ground buss. Each of the isolation transformers also includes a secondary winding having a first end coupled to the positive phase secondary electrode buss and a second end coupled to the negative phase secondary electrode buss. The plasma treatment system further includes a plurality of electrodes in a vacuum chamber. Each of the electrodes is coupled with the positive phase primary electrode buss or with the negative phase primary electrode buss.

In yet another embodiment, a method is provided for powering electrodes in a plasma treatment system with radio frequency (RF) power. The method includes exciting a power buss with the RF power, transferring a first portion of the RF power from the power buss to a first positive phase buss through a plurality of isolation transformers, and transferring a second portion of the RF power from the power buss to a first negative phase buss through the plurality of isolation transformers. The first portion of the RF power is transferred from the first positive phase buss to a second positive phase buss through a first plurality of capacitors and from the second positive phase buss to a first plurality of electrodes. The second portion of the RF power is transferred from the first negative phase buss to a second negative phase buss through a second plurality of capacitors and from the second negative phase buss to a second plurality of electrodes.

BRIEF DESCRIPTION OF THE FIGURES

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Figure 1:
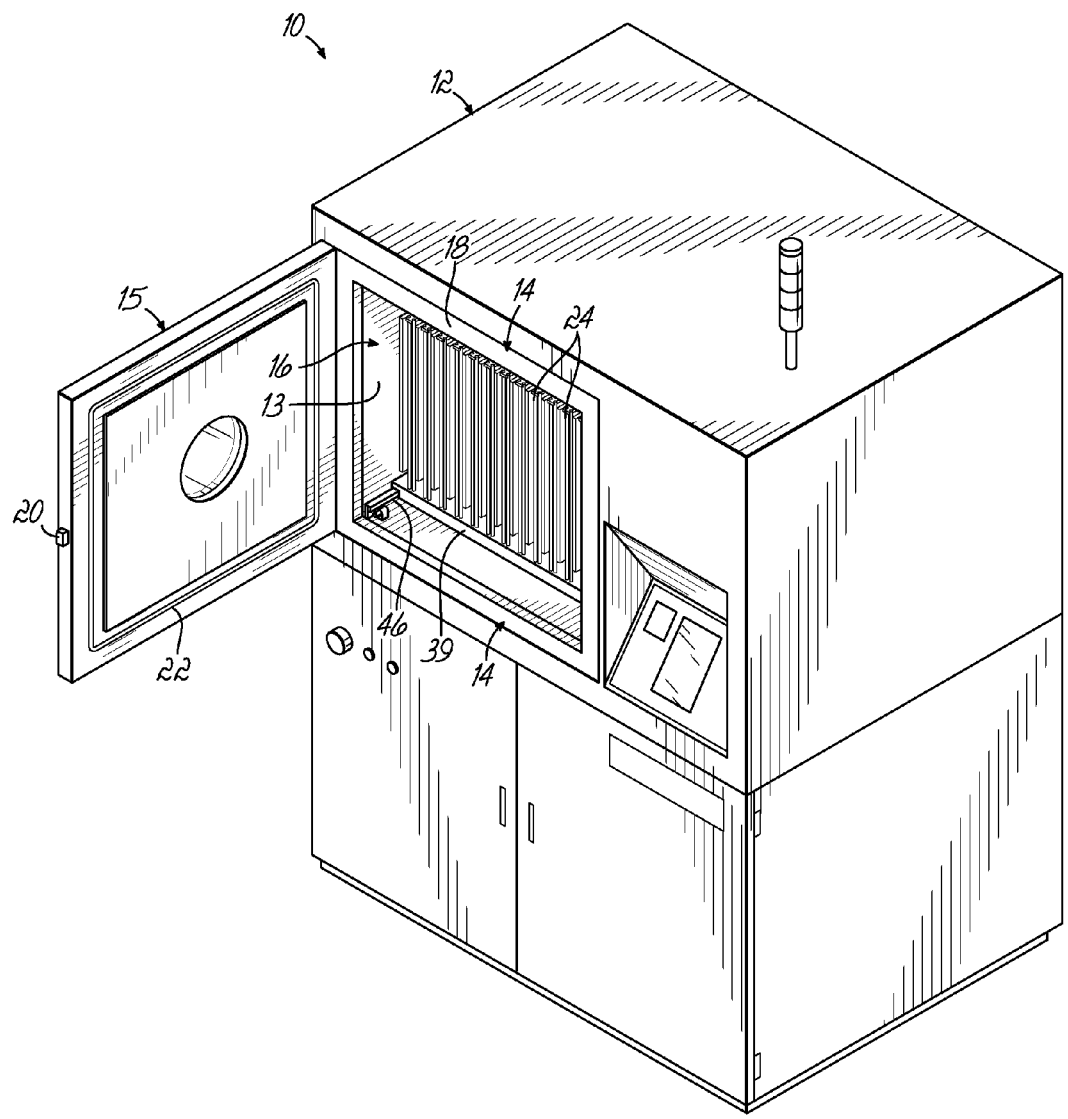
FIG. 1 is a front perspective view of a multiple-electrode plasma treatment system.
Figure 2:
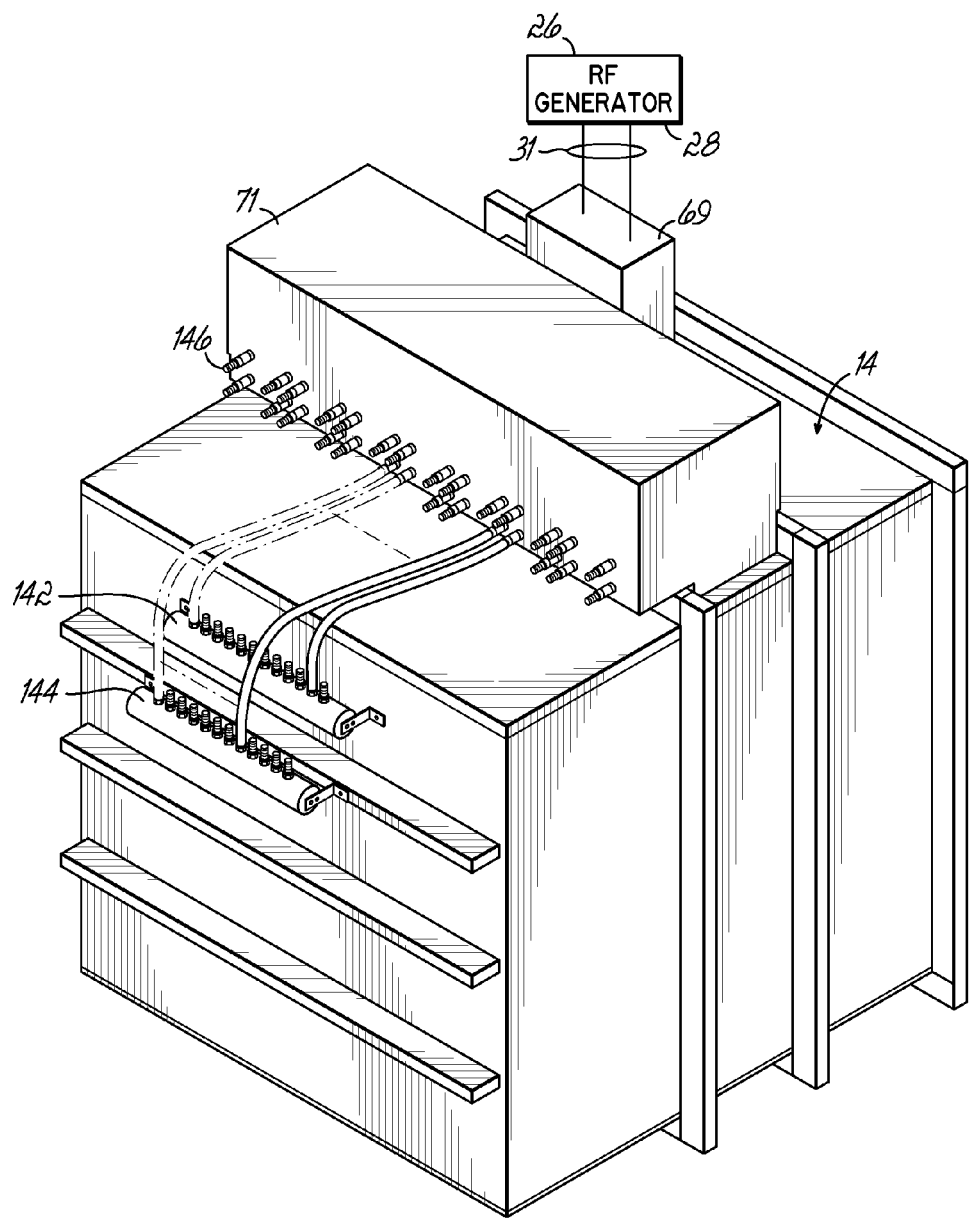
FIG. 2 is a rear perspective view of a multiple-electrode plasma treatment system with the outer enclosure removed to show an RF bussing system attached to the top of a vacuum chamber in accordance with an embodiment of the invention.

Embodiments of the invention are related to radio frequency (RF) bussing systems for a multi-electrode plasma treatment system. The RF bussing system couples an RF power supply to multiple electrodes through a series of buss bars, transformers, and impedance matching elements. An RF power buss bar and a ground buss bar are electrically coupled to the RF power supply to provide a single feed-point for the bussing system. The power and ground buss bars in turn are electrically coupled to two secondary electrode bus bars by a plurality of isolation transformers, which distribute RF signals that are 180 degrees out of phase to positive and negative phase secondary electrode buss bars. The isolation transformers are spatially distributed so that the respective secondary electrode buss bars are coupled in multiple locations along their lengths. Each secondary electrode buss bar is coupled to an associated primary electrode buss bar by a plurality of capacitors with connection points distributed spatially along the primary and secondary electrode buss bars. The two primary electrode buss bars in turn are coupled to a plurality of electrodes in an alternating configuration so that adjacent electrodes are supplied with RF signals that are 180 degrees out of phase. Each primary electrode buss bar is also coupled to ground by an inductor, which forms an impedance matching network with the capacitors. Electrodes being driven by the same phase RF signal may be further electrically coupled through one of two buss bars internal to the plasma chamber. The distributed configuration of isolation transformers, capacitors, and inductors provides improved impedance matching and more even distribution of RF power between the electrodes. This even power distribution improves plasma uniformity and allows the plasma treatment system to operate with higher RF power supply frequencies than would be possible with conventional RF power supply bussing.

With reference to FIGS. 1-4 in which like reference numerals refer to like features, a plasma treatment system 10 includes a cabinet or enclosure 12, a vacuum chamber 14, and an evacuable space 16 surrounded by sidewalls 13 of the vacuum chamber 14. The evacuable space 16 is accessed through an access opening 18 in the vacuum chamber 14. A chamber door 15 can be opened to reveal access opening 18, through which the evacuable space 16 is accessed, and closed to supply a fluid-tight seal that isolates the evacuable space 16 from the surrounding ambient environment. The chamber door 15, which is attached adjacent to the access opening 18 by hinges positioned along one side edge of the vacuum chamber 14, carries a latch 20 that engages another portion of the vacuum chamber 14 when the chamber door 15 is in the closed position. The latch 20 is used to secure the chamber door 15 in a sealed engagement with the rest of the vacuum chamber 14. A sealing member 22, which encircles the periphery of the chamber door 15, mediates the sealed engagement. The vacuum chamber 14 is formed of an electrically conductive material suitable for high-vacuum applications, such as an aluminum alloy or stainless steel, and is connected with electrical ground. One such plasma treatment system is described in U.S. Patent Pub. No. 2009/0288773, entitled "Multiple-Electrode Plasma Processing Systems with Confined Process Chambers and Interior-Bussed Electrical Connections with the Electrodes", the disclosure of which is incorporated herein by reference in its entirety. The plasma treatment system 10 includes a plurality of electrodes 24, which are nominally identical, located inside the vacuum chamber 14 and a plasma excitation source in the representative form of a radio-frequency (RF) generator 26. The RF generator 26 includes an output 28 that is coupled to one or more conductive members within an RF bussing system enclosure 71 through an impedance matching network 27 (FIG. 5). The conductive members may be part of an RF bussing system 70 (FIGS. 5, 6A-D) that couples the electrodes 24 to the RF generator 26 as described in detail below. The vacuum chamber 14 may serve as an unpowered, grounded electrode. The RF generator 26 typically outputs a signal at a frequency of about 13.56 MHz, although other operating frequencies in the kHz to MHz range may be used. The power supplied by the RF generator 26 may range from about 4000 watts to about 8000 watts at 13.56 MHz. However, a person having ordinary skill in the art will appreciate that the system 10 may be modified to permit the delivery of different bias powers or, alternatively, may permit the utilization of a direct current (DC) power supply. The plasma treatment system 10 may also have an electrode cooling system that includes a coolant distribution manifold 142 and a coolant collection manifold 144 fluidically coupled to the electrodes 24 through the RF bussing system enclosure 71.

The electrodes 24 are suspended from one of the sidewalls 13 of the vacuum chamber 14 with a uniform spacing between the juxtaposed pairs 25 of electrodes 24. An localized process cell or chamber 34 (FIG. 3) is defined by the space between each adjacent pair 25 of juxtaposed electrodes 24. Each electrode 24, other than the peripherally outermost electrodes 24, participates in two adjacent pairs 25 with its nearest-neighbor electrodes 24. Each of the peripherally outermost electrodes 24 only participates in a single adjacent pair 25. The electrodes 24 may be spaced laterally at a suitable distance to allow formation of a plasma when the electrodes 24 are excited and to accept one of the panels 40.

Figure 3:
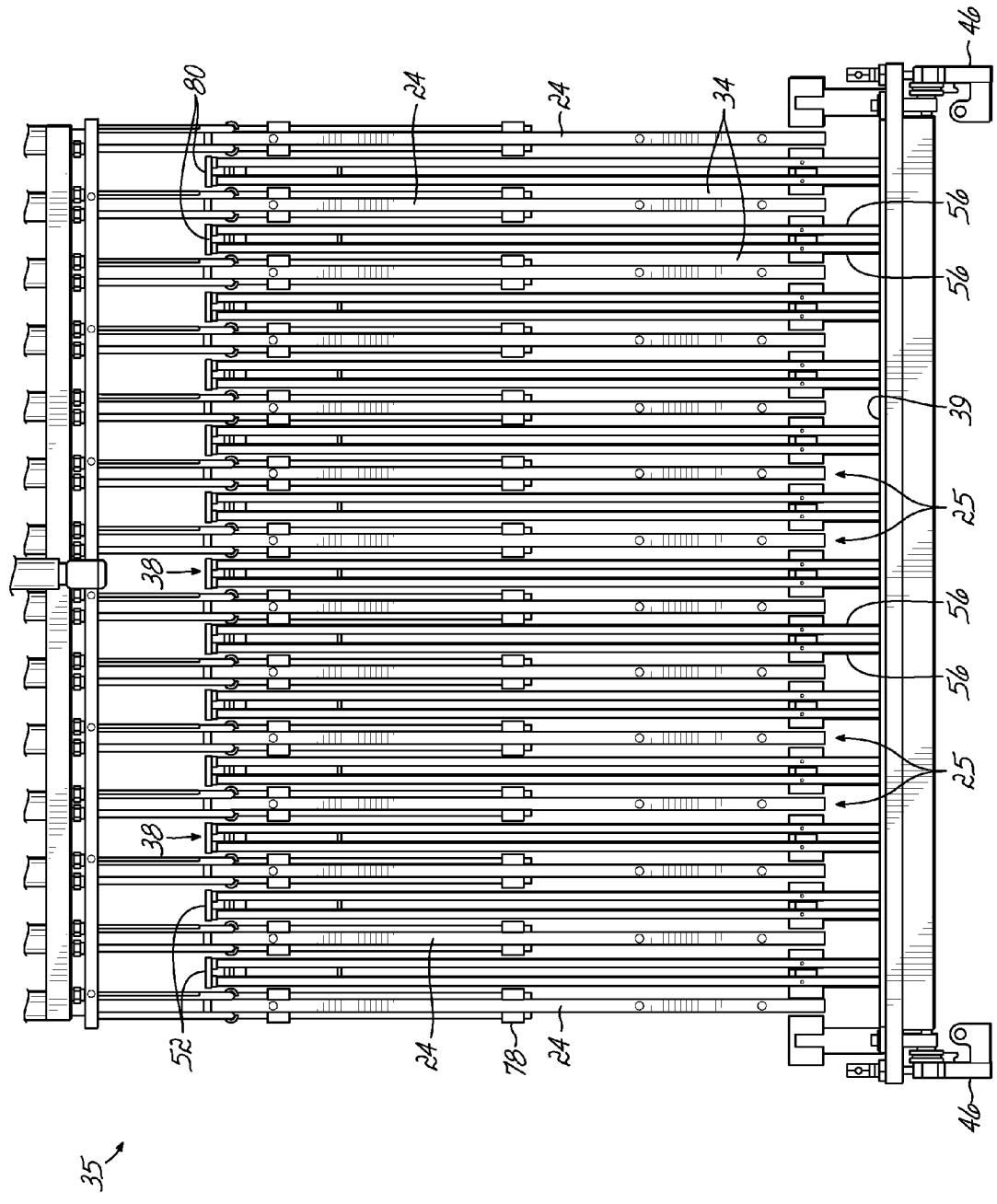
FIG. 3 is an end view of electrodes and product holders of the multiple-electrode plasma treatment system in which the products held by the product holders are omitted for clarity of description.
Figure 3A:
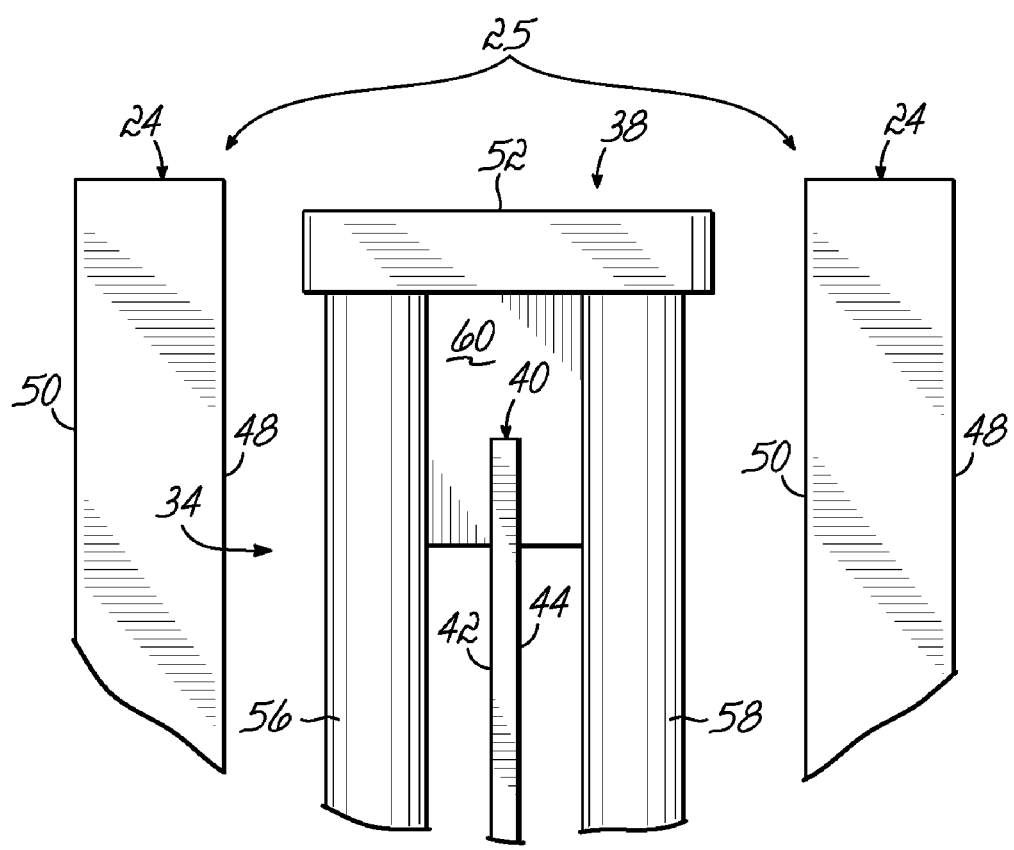
FIG. 3A is an enlarged view of a portion of FIG. 3 with a product visible between the adjacent pair of electrodes and held by the product holder between the adjacent pair of electrodes.
Figure 4:
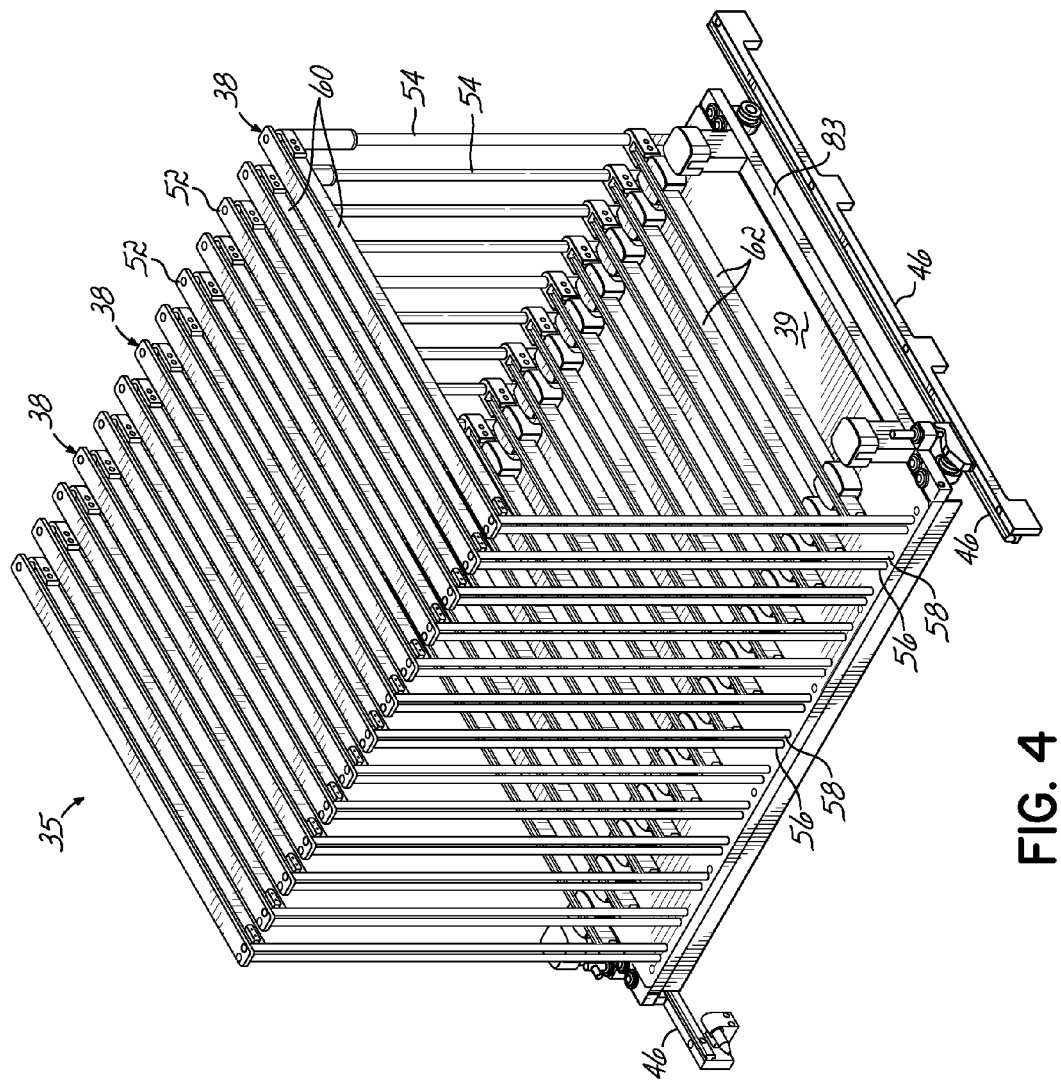
FIG. 4 is a perspective view of a rack of product holders that is used to hold the products at treatment positions in the process chambers inside the multiple-electrode plasma treatment system.
Figure 5:
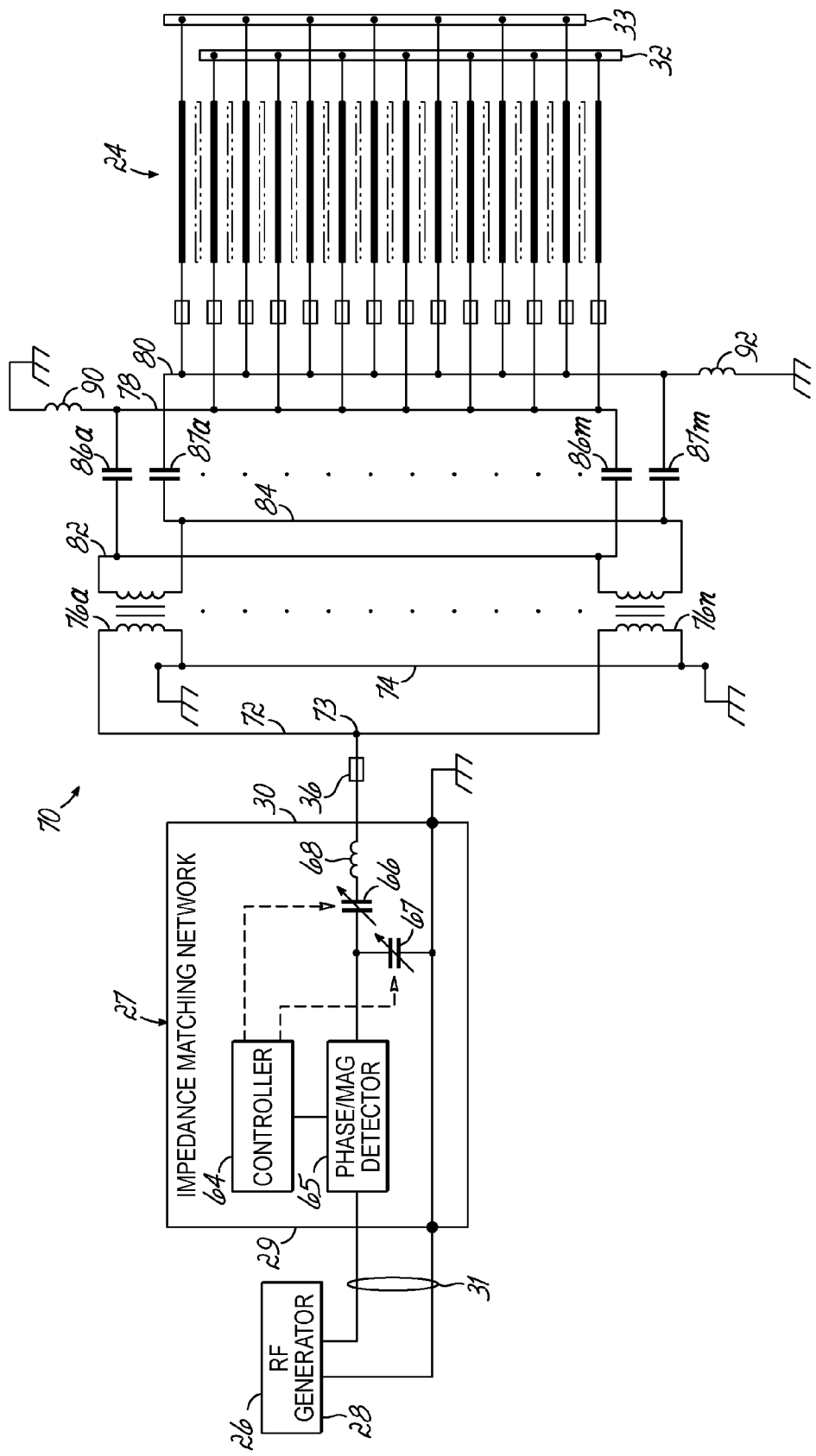
FIG. 5 is a schematic view of an RF bussing system for the plasma treatment in accordance with an embodiment of the invention.

With reference to FIGS. 3 and 4, a rack 35 for use with the plasma treatment system 10 includes multiple product holders 38, and a bottom plate 39 disposed between the product holders 38 and the bottom sidewall 13 of the vacuum chamber 14. Each product holder 38 of rack 35 is framed by a horizontal top bar 52, a vertical member in the representative form of a rear rod 54, and vertical members in the representative form of a pair of front rods 56, 58. The rear rod 54, which is located near the rear sidewall 13 of the vacuum chamber 14 when the rack 35 is positioned in the evacuable space 16, connects one end of the top bar 52 with the bottom plate 39. The front rods 56, 58, which are located near the chamber door 15 of the vacuum chamber 14 when the rack 35 is positioned in the evacuable space 16 and the chamber door 15 is closed, connect an opposite end of the top bar 52 with the bottom plate 39. Upper and lower cross members 60, 62 of each product holder 38 are mechanically connected to the rods 54, 56, 58 and cooperate to support one of the products, shown here in representative form as a panel 40. At least one of the cross members 60, 62 may be vertically moveable along the rods 54, 56, 58 to adjust the area of the opening framed by the rods 54, 56, 58 and the cross members 60. The cross members 60, 62 may thereby be configured to accommodate panels 40 of different sizes.

The product holders 38 are nominally identical and configured support the panels 40 inside the vacuum chamber 14. Each of the panels 40 includes a first surface 42 and a second surface 44 opposite the first surface, and is insertable into one of the product holders 38 in the rack 35. After the rack 35 is populated with a lot or batch of panels 40, the chamber door 15 is opened and the rack 35 is placed on tracks 46 inside vacuum chamber 14. Following the transfer, the rack 35 is positioned inside the vacuum chamber 14 so the chamber door 15 can be closed to provide a sealed environment ready for evacuation by a vacuum pumping system (not shown). While the panels 40 in rack 35 are processed in the plasma treatment system 10, another rack (not shown) similar to rack 35 may be loaded with another batch of panels 40 and, when rack 35 is removed after processing, immediately loaded into the vacuum chamber 14 for processing more panels 40.

After loading, one of the panels 40 may be disposed in each localized process chamber 34 and, when the plasma treatment system 10 is operating, both opposite surfaces 42, 44 of each panel 40 are plasma treated. While supported by the product holders 38 of rack 35 inside the vacuum chamber 14, the panels 40 are oriented in respective planes generally parallel to respective planes containing the electrodes 24. The first surface 42 of the panel 40 confronts a surface 48 of one of the juxtaposed electrodes 24 in each adjacent pair 25. The second surface 44 of the panel 40 confronts a surface 50 of the other of the juxtaposed electrodes 24 in each adjacent pair 25. Each of the electrodes 24 has sufficient length and width so that the outer peripheral edges of panel 40 are disposed inside the outer perimeter of the adjacent pair 25 of electrodes 24. The panels 40 are typically left in an electrically floating state relative to the electrodes 24 and relative to the vacuum chamber 14.

With reference to FIGS. 5, 6A-6D and 7 in which like reference numerals refer to like features and in accordance with an embodiment of the invention, the RF bussing system 70 of the plasma treatment system 10 couples the electrodes 24 to the RF generator 26 through the impedance matching network 27. Alternating electrodes 24 being driven from a common buss within the RF bussing system may be further electrically coupled within the evacuable space 16 by either a positive phase chamber electrode buss 32 or a negative phase chamber electrode buss 33. Power may be delivered from the RF generator 26 to the impedance matching network 27 by a transmission line or cable 31 electrically coupling the output 28 of the RF generator 26 to an input 29 of the impedance matching network 27. The cable 31 may be connectorized at each end using a suitable connector to facilitate the setup and teardown of the plasma treatment system 10, and may be formed from industry standard RG-393 or some other suitable coax cable.

The impedance matching network 27 may include a controller 64, a phase/magnitude detector 65, a series capacitor 66, a shunt capacitor 67, and a series inductor 68 contained within a metal enclosure 69. Typically, the series inductor 68 is characterized by a fixed inductance, and the capacitors 66, 67 are variable capacitors that provide a capacitance value which is adjustable by the controller 64. The controller 64 receives feedback from the phase/magnitude detector 65 containing information relating to the phase and magnitude of the forward and/or reverse RF power passing through the phase/magnitude detector 65. In response to the feedback from the phase/magnitude detector 65, the controller 64 adjusts the capacitance of the variable capacitors 66, 67 to reduce the reverse RF power passing thorough the phase/magnitude detector 65, thereby reducing the power reflected back to the RF generator 26. The controller 64 may adjust the capacitance of the capacitors 66, 67 by operation of actuators, such as reversible DC motor drives, coupled to the variable capacitors, which may be rotatable parallel plate capacitors. The impedance matching network 27 thereby provides an improved impedance match between the output 28 of RF generator 26 and the load presented by the RF bussing system 70. Matching the impedance of the input of the RF bussing system 70 to the output 28 of RF generator 26 may increase the power delivered to the RF bussing system 70 by reducing the amount of power reflected back to the RF generator 26. By causing less power to be wasted in reflections back to the RF generator 26, the impedance matching network 27 may reduce the load on the RF generator 26 during the operation of the plasma treatment system 10.

The RF bussing system 70, which is disposed inside the enclosure 71, includes a power buss 72, a ground buss 74, a positive phase primary electrode buss 78, a negative phase primary electrode buss 80, a positive phase secondary electrode buss 82, and a negative phase secondary electrode buss 84. A plurality of isolation transformers 76a-76n electrically couples the power and ground busses 72, 74 to the secondary electrode busses 82, 84. A plurality of coupling capacitors 86a-86m electrically couples the positive phase primary electrode buss 78 to the positive phase secondary electrode buss 82. A plurality of coupling capacitors 87a-87m couples the negative phase primary electrode buss 80 to the negative phase secondary electrode buss 84. The positive and negative phase primary electrode busses 78, 80 may have peripheral ends 79, 83 electrically coupled to ground by load coils 90, 92, respectively. The power, ground, and electrode busses 72, 74, 78, 80, 82, 84 may be comprised of conductive bars formed from any suitable metal such as aluminum, copper, brass, or other alloys and extend generally across the width of the enclosure 71 of RF bussing system 70. In one specific embodiment of the RF bussing system 70, the conductive bars may be formed from aluminum and may have a thickness of about 0.5 inch (about 13 mm), a width of about 1 inch (about 25 mm), and a length of about 30.9 inches (about 784 mm), although the embodiments of the invention are not so limited.

RF power enters the RF bussing system 70 through an RF input feedthrough 36 that penetrates a front sidewall 102 of the RF bussing system enclosure 71 at a position generally below a center feed-point 73 of power buss 72. An exterior end of RF input feedthrough 36 may be configured to electrically couple to a center conductor of the output 30 of impedance matching network 27, and an interior end of RF input feedthrough 36 may be electrically coupled to a conductive member 75. The conductive member 75 may be formed from suitable metal such as aluminum, copper, brass, or other alloy and traverses the vertical distance between the interior end of RF input feedthrough 36 and the center feed-point 73 of the power buss 72. The conductive member 75 may thereby electrically couple the interior end of the RF input feedthrough 36 to the center feed-point 73 of power buss 72. The center feed-point 73 of power buss 72 may be located on a bottom surface of the power buss 72 at a point approximately midway between the left and right peripheral ends of the power buss 72. The RF input feedthrough 36 thereby provides an electrically isolated conductive path through the front sidewall 102 of the RF bussing system enclosure 71 that electrically couples the output 30 of the impedance matching network 27 and the center feed-point 73 of power buss 72.

An RF ground connection between the impedance matching network 27 and the RF bussing system 70 may be provided by electrically coupling the enclosure 69 of the impedance matching network 27 to the enclosure 71 of the RF bussing system 70. This may be accomplished, for example, by bolting or otherwise mechanically coupling the enclosure of impedance matching network 27 to the enclosure 71 of the RF bussing system 70. The ground connection may also include one or more braided cables and/or other conductive wires or cables having one end electrically coupled to the enclosure 69 of the impedance matching network 27 and another end electrically coupled to the enclosure 71 of the RF bussing system 70.

Figure 6A:
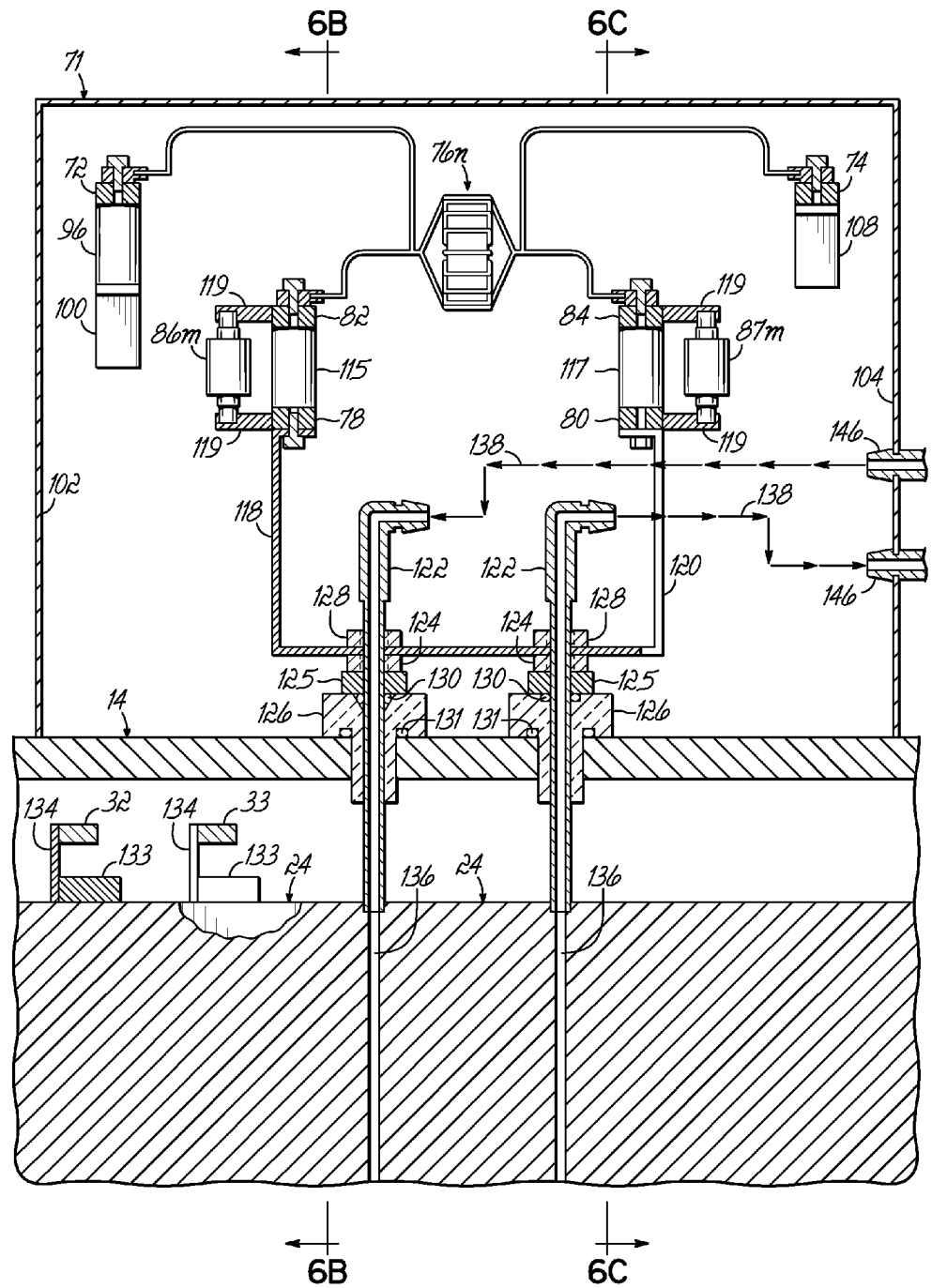
FIG. 6A is a cross-sectional view of the RF bussing system of FIG. 5 that is taken inside the RF bussing system of FIG. 1 and that shows the relative locations of the RF buss bars, coupling capacitors, isolation transformers, and associated structural components in accordance with an embodiment of the invention.
Figure 6B:
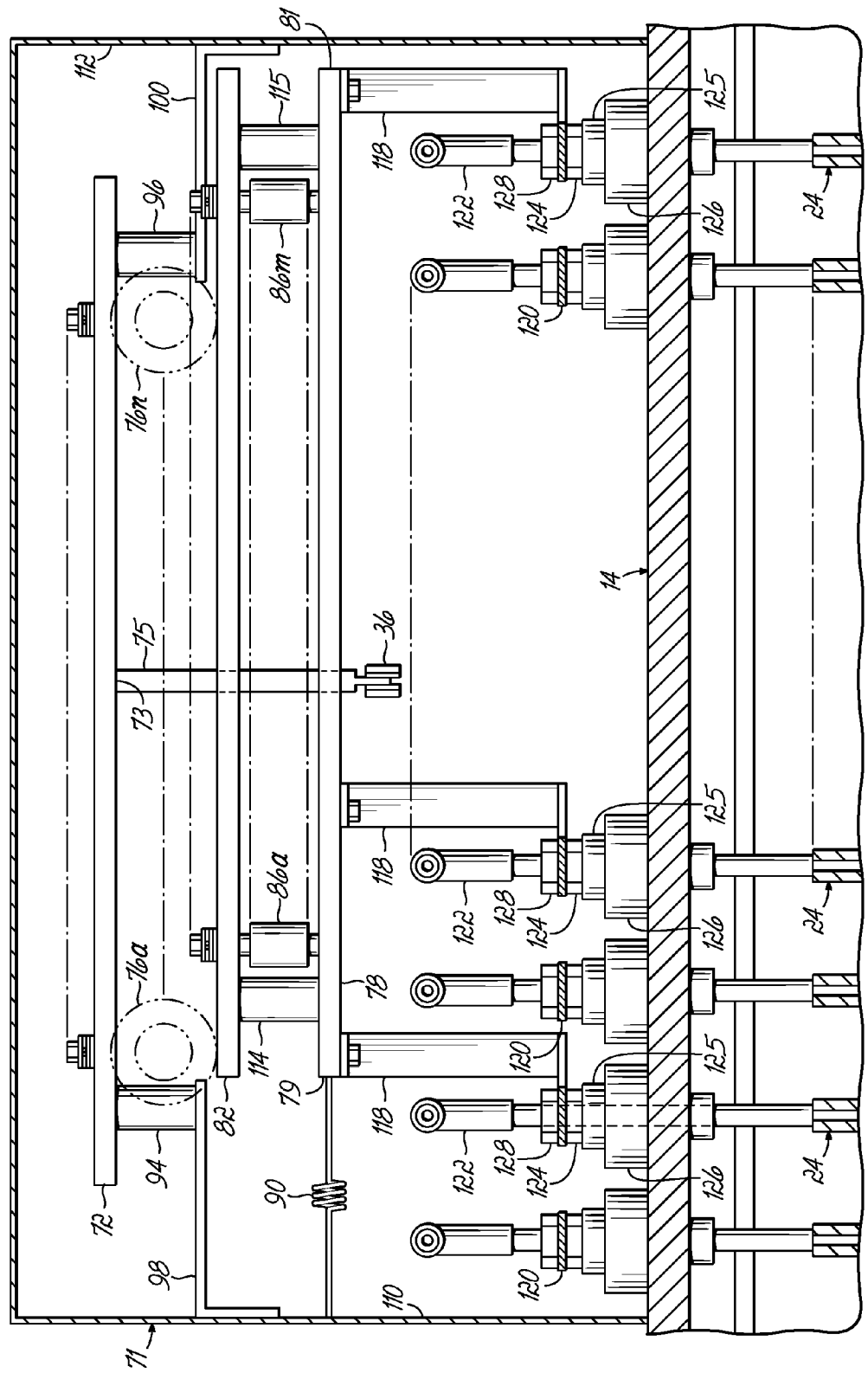
FIG. 6B is a cross-sectional view taken generally along line 6B-6B in FIG. 6A.

The power buss 72 may be located laterally adjacent to the front sidewall 102 of RF bussing system enclosure 71 and is secured to the RF bussing system enclosure 71 through insulating supports 94, 96 (FIG. 6B). The insulating supports 94, 96 are located generally near the opposing peripheral ends of the power buss 72 and electrically isolate the power buss 72 from the RF bussing system enclosure 71. The insulting supports 94, 96 may be formed from a ceramic, polytetrafluoroethylene (PTFE), or any other suitable insulting material and may be fixed to the right and left sidewalls 110, 112 of RF bussing system enclosure 71 by brackets 98, 100. The ground buss 74 may be located laterally adjacent to a back sidewall 104 of RF bussing system enclosure 71 in a similar manner as the power buss 72. The ground buss 74 may be mechanically secured to the RF bussing system enclosure 71 by conductive metal brackets 106, 108 (FIG. 6C), which support and electrically couple the opposing peripheral ends of ground buss 74 to the right and left sidewalls 110, 112 of RF bussing system enclosure 71.

The power and ground busses 72, 74 are coupled to secondary electrode busses 82, 84 by a plurality of isolation transformers 76a-76n. The secondary electrode busses 82, 84 are generally parallel to the power and ground busses 72, 74 and lie in a horizontal plane generally parallel to the top surface of the bussing system enclosure 71 and generally below the power and ground busses 72, 74. Each of the isolation transformers 76a-76n includes a primary winding, a secondary winding, and a toroidal core formed from a magnetic material having a high permeability and a low conductivity, such as a ferrite. In one specific embodiment of the invention, the primary and secondary windings may each be formed using an insulated two conductor, or bifilar, wire that is terminated on each end by a lug. The primary and secondary windings are electromagnetically coupled by the core so that signals coupled to the primary winding induce similar signals in the secondary winding. The ends of the primary and secondary windings may be terminated by spade or eyelet lugs, or some other suitable terminal that facilitates connections to the busses 72, 74, 82, 84. The magnitude of the output signal on the secondary winding relative to the magnitude of the input signal on the primary winding may be a function of the ratio between the number of turns in the primary winding and the number of turns in the secondary winding. In one embodiment of the invention, the isolation transformers 76a-76n have a 1:1 ratio between the primary and secondary windings. Because there is no direct current path between the primary and secondary windings, the isolation transformers 76a-76n provide direct current isolation between the power and ground bars 72, 74 and the secondary electrode busses 82, 84.

RF signals are provided to each of the isolation transformers 76a-76n by electrically coupling one end of the primary winding to the power buss 72, and electrically coupling the other end of the primary winding to the ground buss 74. RF signals on the power buss 72 thereby induce RF signals in the secondary windings of the isolation transformers 76a-76n. One end of each secondary winding of the isolation transformers 76a-76n is electrically coupled to the positive phase secondary electrode buss 82, and the other end of each secondary winding of the isolation transformers 76a-76n is coupled to the negative phase secondary electrode buss 84. To facilitate implementing the transformer winding connection to the busses, the busses 72, 74, 82, 84 may include a plurality of threaded holes spaced at intervals along the busses 72, 74, 82, 84 to provide isolation transformer connection points. The transformer connection points may provide a convenient method of electrically coupling the windings of the isolation transformers 76a-76n to the power, ground and secondary busses 72, 74, 82, 84. For example, the lugs electrically coupled to the ends of the transformer windings might be fastened to a selected isolation transformer connection point by a screw. The number of isolation transformer connection points may exceed the number of isolation transformer winding ends, which provides multiple connection location options for each isolation transformer winding. By using multiple isolation transformers 76a-76n connected at regular intervals along the respective busses 72, 74, 82, 84, a more even power distribution may be provided to the secondary electrode busses 82, 84. The use of multiple isolation transformers 76a-76n may also increase the total power handling ability of the RF bussing system 70. In one specific embodiment of the invention, the RF bussing system 70 may include ten (10) isolation transformers working in parallel, although embodiments of the invention are not limited to any particular number of isolation transformers.

The isolation transformers 76a-76n are typically connected to the busses 72, 74, 82, 84 at evenly spaced connection points. The positive and negative secondary electrode busses 82, 84 may thereby be provided with RF signals having approximately the same magnitude and a relative phase difference of 180 degrees. As previously discussed, additional isolation transformer connection points may also be provided on the busses 72, 74, 82, 84 so that individual isolation transformer connection points may be moved relative to the other isolation transformer connection points. The additional connection points may thereby provide a method of adjusting the RF power distribution along the secondary electrode busses 82, 84 by allowing individual isolation transformer windings to be electrically coupled to different positions along the length of the buss in question. The RF bussing system 70 may thereby provide a tuning mechanism to adjust the relative distribution of RF power between electrodes 24 to compensate for minor variations between plasma treatment systems 10. By way of example, if the plasma treatment system 10 is depositing films having a noticeably different thickness near a representative one of the plurality of electrodes 24, the connection points of the transformer windings near the section of the secondary electrode buss feeding the offending electrode might be re-positioned to improve the RF power balance between the electrodes 24.

The positive phase primary electrode buss 78 is mechanically coupled to the positive phase secondary electrode buss 82 by insulating supports 114, 115 (FIG. 6B) located near the peripheral ends of the positive phase electrode busses 78, 82. Similarly, the negative phase primary electrode buss 80 is mechanically coupled to the negative phase secondary electrode buss 84 by insulating supports 116, 117 located near the peripheral ends of the negative phase electrode busses 80, 84. The primary electrode busses 78, 80 are thereby located generally below their respective secondary electrode busses 82, 84. The positive phase secondary electrode buss 82 may be electrically coupled to the positive phase primary electrode buss 78 by the coupling capacitors 86a-86m. Similarly, the negative phase secondary electrode buss 84 may be electrically coupled to the negative phase primary electrode buss 80 by the coupling capacitors 87a-87m. In one embodiment of the invention, the coupling capacitors 86a-86m, 87a-87m are high voltage 1000 pF cylindrical ceramic doorknob capacitors having contact terminals formed by vertical posts projecting from the top and bottom of the capacitors. In one specific embodiment of the invention, six (6) coupling capacitors couple each primary electrode buss with each secondary electrode buss for a total of twelve (12) coupling capacitors, although other numbers of coupling capacitors may be used and embodiments of the invention are not so limited. The connections between the terminals of the coupling capacitors 86a-86m, 87a-87m may be spaced at regular intervals along their respective primary and secondary electrode busses. To facilitate installation and replacement of the coupling capacitors 86a-86m, 87a-87m, spring loaded clips 119 (FIG. 6A) may be attached to outward facing sides of the primary and secondary electrode busses in a vertically aligned arrangement. The spring loaded clips 119 may be configured to accept terminal posts projecting from the tops and bottoms of the coupling capacitors, thereby electrically coupling the coupling capacitors to primary and secondary electrode busses 78, 80, 82, 84.

The positive phase primary electrode buss 78 may be electrically coupled to every other of the electrodes 24 through conductive metal brackets 118. In a similar manner, the negative phase primary electrode buss 80 may be electrically coupled to the remaining electrodes 24 through conductive metal brackets 120. Each electrode 24 may thereby be excited with a signal which is 180 degrees out of phase with the immediately adjacent electrode(s) 24. To provide electrical coupling between the electrodes 24 and the brackets 118, 120, electrical feedthroughs 122 are coupled to each electrode 24 using a suitable method of attachment, such as welding. The electrical feedthroughs 122 may be hollow so that coolant may be provided to the electrodes 24 through the electrical feedthroughs 122.

The electrical feedthroughs 122 penetrate a top side of the vacuum chamber 14 and may have a threaded top ends that are secured by bottom nuts 124 to insulating structures or grommets 126, which electrically isolate the electrical feedthroughs 122 from the vacuum chamber 14. The grommets may be formed from a suitable insulating material, such as polytetrafluoroethylene (PTFE), and include a flange having annular groves configured to accept top and bottom o-rings 130, 131. The grommets 126 may be fastened to the vacuum chamber 14 using screws or other suitable fasteners, which compresses the bottom o-ring 131 to provide an airtight seal between the grommet 126 and a top surface of the vacuum chamber 14. The bottom nut 124 may be tightened against a washer 125 that compresses the top o-ring 130 and securely seats the electrical feedthroughs 122 against a chamfered interior bore of the grommet 126 to provide an airtight seal between the electrical feedthroughs 122 and the grommet 126. The electrical feedthroughs 122 may also supply mechanical support for suspending the electrodes 24 in the vacuum chamber 14, and for supporting the primary and secondary electrode busses 78, 80, 82, 84 within the RF bussing system enclosure 71.

The brackets 118, 120 may extend vertically downward from their respective electrode busses and include a substantially right angle bend to provide each bracket with a bottom horizontal section configured to accept the electrical feedthroughs 122 from a single electrode 24. To accommodate lateral offsets in the primary electrode busses, the horizontal sections of brackets 118, 120 may be offset from the vertical sections of brackets 118, 120 by horizontal projections. In the representative embodiment shown in FIGS. 6A-6D, two (2) electrical feedthroughs 122 are attached to each electrode 24. The threaded ends of the electrical feedthroughs 122 pass through holes in the bottom horizontal sections of brackets 118, 120 and may be secured by top nuts 128. The top nuts 128 may be tightened to provide sufficient clamping force against the bottom nuts 124 so as to hold the brackets 118, 120 securely, thereby providing mechanical support and electrical coupling for the primary and secondary electrode busses 78, 80, 82, 84. Alternating electrodes 24 are thereby electrically coupled together by the positive phase primary electrode buss 78 and provided with RF signals 180° out of phase with the remaining alternating electrodes 24, which are electrically coupled together by the negative phase primary electrode buss 80. The plasma provided on the opposite sides of the panel 40 positioned between each adjacent pair 25 of electrodes 24 may thereby be excited by electromagnetic fields having similar energy levels.

The positive phase primary electrode buss 78 may be electrically coupled to ground by the positive phase primary electrode buss load coil 90, and the negative phase primary electrode buss 80 may be electrically coupled to ground by the negative phase primary electrode buss load coil 92. Each load coil 90, 92 may be formed from a length of flat magnet wire having a width of about 0.25 inches (about 6.4 mm) and a thickness of about 0.125 inches (about 3.2 mm) that has been shaped into a coil having approximately 3.5 turns and an inside diameter of about 3 inches (about 76 mm). Each of the load coils 90, 92 may be wound so that the width dimension of the magnet wire is orthogonal to the center axis of the respective one of the load coils 90, 92. The opposing ends of the length of flat magnet wire forming the load coils 90, 92 may thereby form first and second inductor terminals.

Figure 6C:
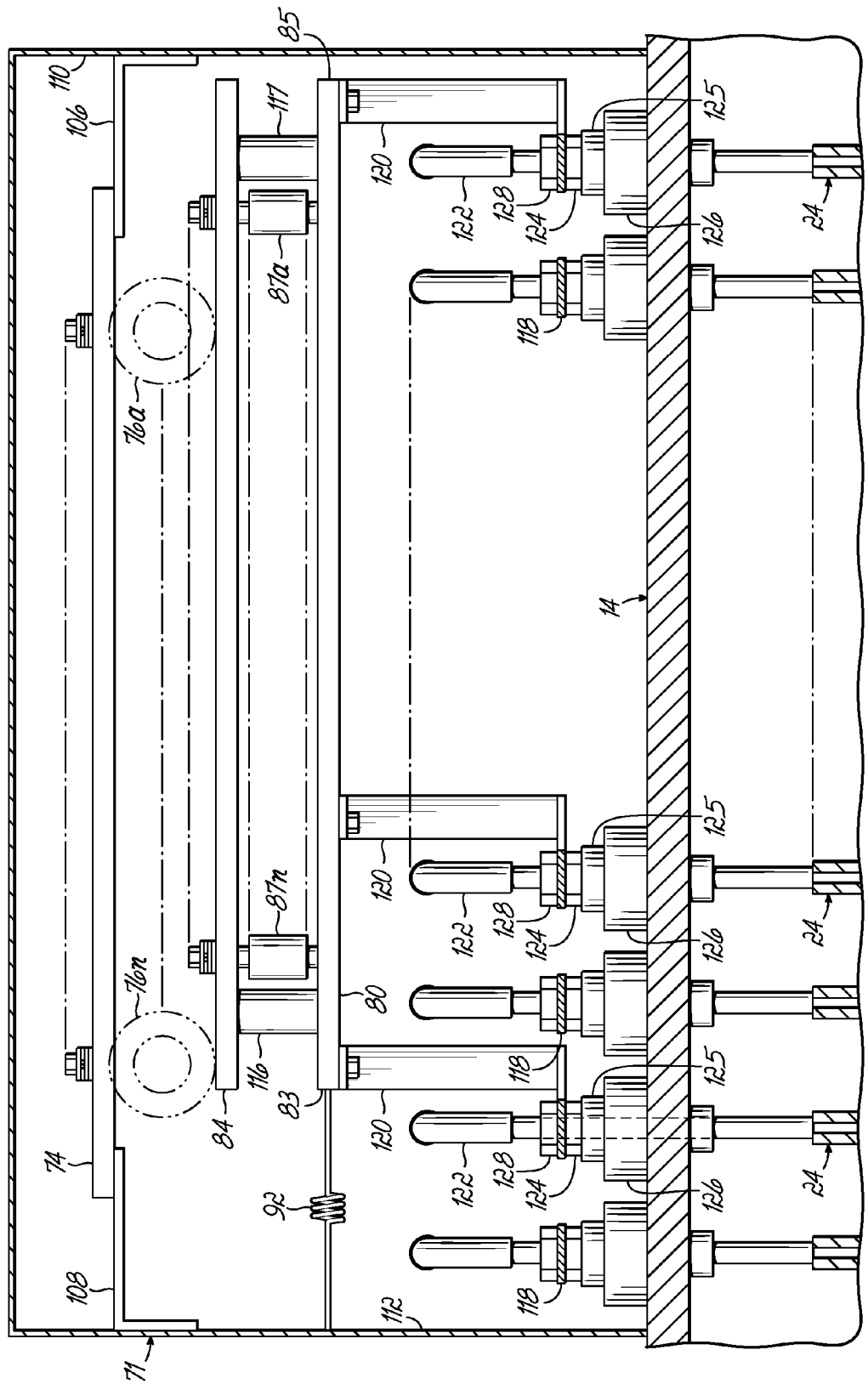
FIG. 6C is a cross-sectional view taken generally along line 6C-6C in FIG. 6A.
Figure 6D:
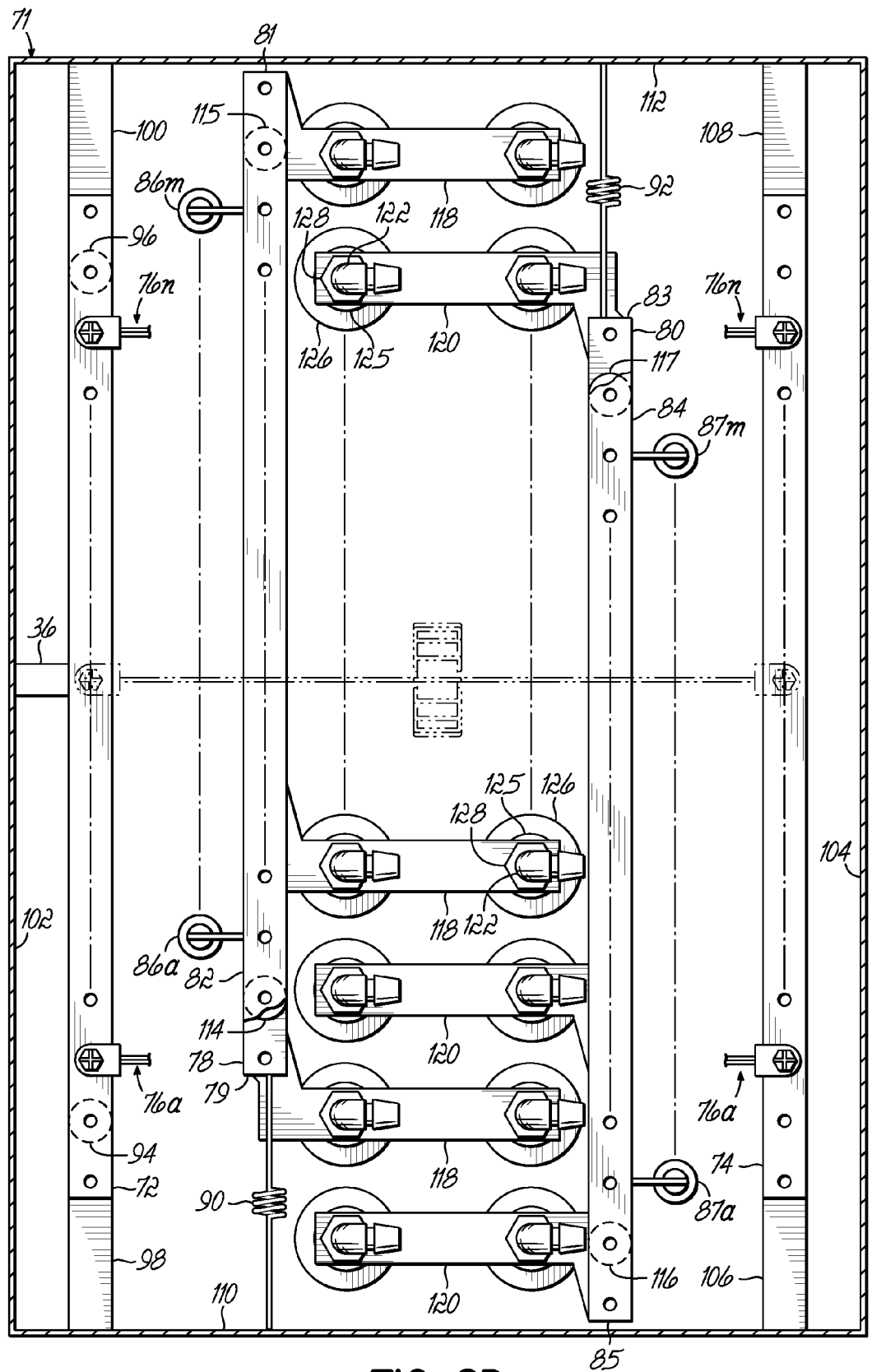
FIG. 6D is a top view of the RF bussing system of FIG. 6A.
Figure 7:
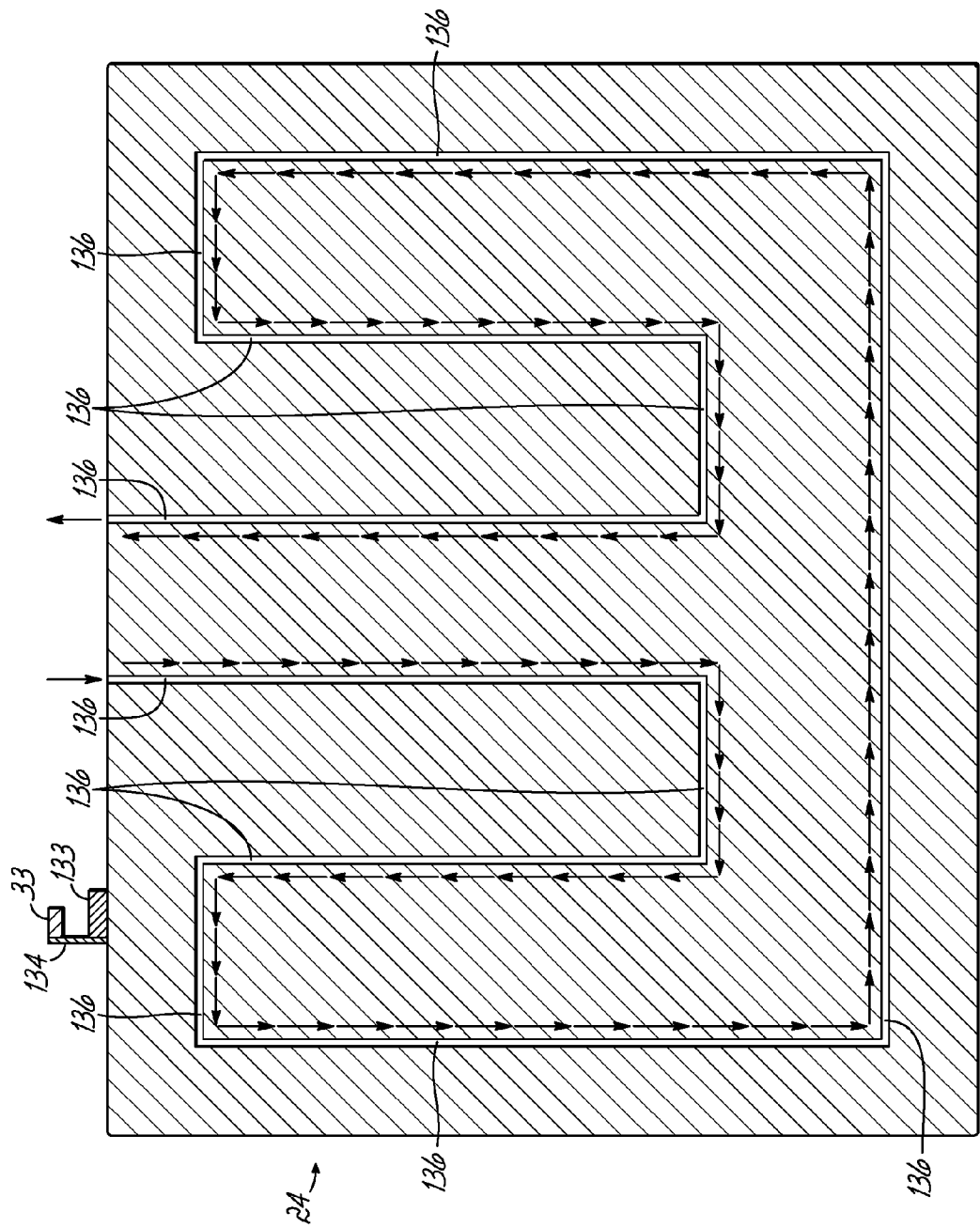
FIG. 7 is a cross-sectional view of an electrode showing the electrode cooling passages and a chamber electrode buss.

The first terminal of buss load coil 90 may be electrically coupled to one peripheral end 79 of the positive phase primary electrode buss 78 and the second terminal of load coil 90 may be electrically coupled to the RF bussing system enclosure 71 (FIG. 6B). The positive phase primary electrode buss 78 may thereby be electrically coupled to ground through the load coil 90. Similarly, the first terminal of load coil 92 may be electrically coupled to one peripheral end 83 of the negative phase primary electrode buss 80 and the second terminal of load coil 92 may be electrically coupled to the RF bussing system enclosure 71 (FIG. 6C). The negative phase primary electrode buss 80 may thereby be electrically coupled to ground through the load coil 92. The peripheral ends 79, 83 of the primary electrode busses 78, 80 to which the load coils 90, 92 are electrically coupled may be on opposite sides of the RF bussing system enclosure 71 due to space considerations and to reduce electromagnetic coupling between the load coils 90, 92. However, the invention is not limited to either the position or number of the load coils 90, 92. For example, in alternative embodiments of the invention, each of the primary electrode busses 78, 80 might be electrically coupled to ground by load coils at both peripheral ends 79, 81, 83, 85 of the electrode buss 78, 80 in question. The second terminals of the load coils 90, 92 might also be coupled to RF grounds having DC voltage biases with respect to the enclosure 71 ground to provide a DC bias between adjacent electrodes 24.

In addition to providing DC ground to the primary electrode busses 78, 80, the shunt reactance of the load coils 90, 92 may interact with the series reactance of the coupling capacitors 86a-86m, 87a-87m to modify the RF input impedance presented by the RF bussing system 70. This modified RF impedance may more closely match the output impedance of the RF generator 26 than the input impedance of an RF bussing system lacking the secondary electrode busses 82, 84, coupling capacitors 86a-86m, 87a-87m, and/or load coils 90, 92. The improved RF impedance match between the RF generator 26 and the RF bussing system 70 may allow the impedance matching network 27 to reduce the power reflected back to the RF generator 26 without exceeding the tuning range of the impedance matching network 27. The RF impedance modifications provided by the coupling capacitors 86a-86m, coupling capacitors 87a-87m, and load coils 90, 92 may also reduce the power reflected by the electrode busses back towards the power and ground busses. This reduction in reflected power may reduce internal standing wave ratios (SWR's) within the RF bussing system 70, which may reduce RF power dissipation and the potential for arcing in the isolation transformers 76a-76n. The improved internal matching provided by the coupling capacitors 86a-86m, 87a-87m and load coils 90, 92 may thereby allow the plasma treatment system 10 to operate at higher RF power levels and with lower losses.

To further control the RF power distribution between the electrodes 24, the positive phase chamber electrode buss 32 may be electrically coupled to the electrodes 24 fed from the positive phase primary electrode buss 78. Similarly, the negative phase chamber electrode buss 33 may be electrically coupled to the electrodes 24 fed from the negative phase primary electrode buss 80. The chamber electrode busses 32, 33 may thereby electrically couple alternating electrodes 24 within the vacuum chamber 14. To provide a connection point on the electrodes 24 for the chamber electrode busses 32, 33, a post 133 may be attached to a top peripheral edge of the electrode 24, such as with one or more screws. The post 133 may be offset from a side peripheral edge of the electrode 24 to provide a vertical attachment surface. The post 133 may thereby provide a connection point to the electrode 24, the position of which may be varied relative to the peripheral edges of the electrode 24. Posts 133 that are attached to electrodes 24 being fed by the positive phase electrode buss 78 may be generally aligned along a first line orthogonal to the first and second surfaces 42, 44 of electrodes 24. Posts 133 that are attached to electrodes 24 being fed by the negative phase electrode buss 80 may be generally aligned along a second line laterally offset from and parallel to the first line. The posts 133 attached to the positive phase electrodes 24 may thereby be aligned with the positive phase chamber electrode buss 32, and the posts attached to the negative phase electrodes 24 may thereby be aligned with the negative phase chamber electrode buss 33. The posts 133 may be electrically coupled to the chamber electrode busses 32, 33 by elongated straps 134. To this end, the straps 134 may have holes at first and second peripheral ends configured to accept a screw or other suitable fastener. The first peripheral end of the elongated strap 134 may be attached to the vertical surface of the corresponding post 133, and the second peripheral end of the elongated strap 134 may be attached to the corresponding chamber electrode buss 32, 33.

To allow temperature regulation to the plasma treatment system 10, each of the electrodes 24 may include a network of channels 136 (FIG. 7) used to regulate the temperature of the solid metal plate, which is heated when generating the plasma. To absorb heat from the electrodes 24, distilled water or another suitable heat-exchange liquid or coolant is pumped through the network of channels 136, which may be gun-drilled in the solid metal plates. The coolant enters one of the channels 136 through one of the electrical feedthroughs 122, which is fluidically coupled to the channel 136 and serves as a coolant inlet tube. The coolant exits another of the channels 136 through another of the electrical feedthroughs 122, which is fluidically coupled to the other channel 136 and serves as a coolant outlet tube. The electrical feedthroughs 122 may thereby provide a path by which the coolant from the atmospheric-pressure environment is conveyed into and out of the evacuable space 16 in a sealed manner. In furtherance of this end, the threaded ends of the electrical feedthroughs 122 may be fluidically coupled to one of a plurality of coolant feedthroughs 146 penetrating the back sidewall 104 of the RF bussing system enclosure 71 by coolant distribution tubes (not shown). Coolant may thereby flow, as represented by arrows 138 (FIG. 6A), between the coolant feedthoughs 146 and electrodes 24. The coolant feedthoughs 146 are in turn fluidically coupled to one of either the coolant distribution manifold 142 or the coolant collection manifold 144 on the exterior of the vacuum chamber 14 depending on whether the feedthough is serving a coolant inlet or coolant outlet tube. The coolant manifolds 142, 144 have taps that are coupled by fitted lengths of tubing with the coolant feedthroughs 146 to complete the coolant circuit. A sealed fluid path is thereby provided between the coolant distribution manifold 142 and the electrical feedthroughs 122 that serve as coolant inlet tubes to the electrodes 24. Likewise, a sealed fluid path is provided between the coolant collection manifold 144 and the electrical feedthroughs 122 that serve as coolant outlet tubes to the electrodes 24. Coolant may be circulated though the electrodes 24 by providing a positive pressure in the coolant distribution manifold 142 with respect to the coolant pressure in the coolant collection manifold.

The temperature of the electrodes 24 may be regulated by the circulation of the coolant through the respective channels 136. To that end, the coolant may be supplied from a heat exchanger (not shown) to an inlet port of the coolant distribution manifold 142 and distributed to each of the inlet coolant feedthroughs 146. Once the coolant has circulated through the channels 136 of the electrodes 24, the coolant may be returned to the heat exchanger through an outlet port of the coolant collection manifold 144 or otherwise suitably disposed of. The heat exchanger can adjust the flow rate and temperature of the coolant to either heat or cool the electrodes 24, depending on the desired effect. Because heat is transferred during operation between the electrodes 24 and panels 40, the temperature regulation of the electrodes 24 may also be used to beneficially regulate the temperature of the panels 40 during plasma treatment.

In use and with reference to FIGS. 1-7, the product holders 38 of the rack 35 are populated with panels 40 at a location outside of the vacuum chamber 14, the vacuum chamber 14 is vented to atmospheric pressure, the chamber door 15 is opened to reveal the access opening 18, and the rack 35 is transferred through the access opening 18 into the vacuum chamber 14. The access opening 18 is sealed by closing chamber door 15 and engaging the latch 20. Each of panels 40 is supported by one of the product holders 38 between the electrodes 24 of one of the adjacent pairs 25.

Atmospheric gases resident in the evacuable space 16 inside the vacuum chamber 14 are evacuated using a vacuum pumping system (not shown). A flow of a process gas may be supplied to the evacuable space 16 from the process gas supply while the vacuum chamber 14 is evacuated by the vacuum pumping system. The process gas flow rate may be metered by a mass flow controller to control conditions within the evacuable space 16, such as the gas pressure and mixture. The process gas may be provided to each localized process chamber 34 by a suitable gas delivery system serving each adjacent pair 25 of electrodes 24.

Once a desired process pressure is achieved and stabilized inside the vacuum chamber 14, the RF generator 26 is energized to supply electrical power to the electrodes 24. Electrical power is delivered by the RF bussing system 70 through the electrical feedthroughs 122 to the top edge of the perimeter of each electrode 24. The electrodes 24 forming adjacent pairs 25 are thereby driven by RF signals that are approximately 180 degrees out of phase so that the RF field is largely contained within the process cells 30. The process gas resident between each adjacent pair 25 of electrodes 24 may be partially ionized by the applied RF energy to generate plasma locally in each of the process cells 30. The plasma inside each of the process cells 30 represents partially ionized process gas consisting of ions, electrons, free radicals, and neutral species. Each top bar 52, each set of rods 54, 56, 58, the bottom plate 39, and each adjacent pair 25 of electrodes 24 surround one of the process cells 30 and may cooperate to confine the partially ionized process gas of the plasma within each of the process cells 30 by reducing the escape rate of the partially ionized process gas from the respective localized process chamber 34.

The panels 40 are exposed to the plasma in the process cells 30 for a duration sufficient to treat the exposed opposite surfaces 48, 50 of each panel 40. The ionized gas mixture constituting the plasma is conductive and highly reactive, which promotes the plasma's ability to interact with the panels 40 to perform the prescribed plasma treatment. Plasma-generated active species perform physical processes through ion bombardment and chemical processes through radical/byproduct chemical reactions. Contingent upon the particular process gas or combination of process gases, a different reaction can be caused to occur on the panel surfaces 42, 44. The process recipe may be varied according to the nature of the plasma treatment. If a polymerization process is to be employed, the process gas may include one or more monomer molecules. The monomer molecules may be decomposed in the process of forming the chamber plasma, forming ionized molecules that combine—or polymerize—as they condense on the substrate. The plasma initiated reaction of monomer molecules may thereby form a thin layer of polymer chains and/or three-dimensional networks on the substrate surface. For printed circuit board applications, chemical reactions at the surfaces 42, 44 of the panels 40 may be utilized to remove drill smear and/or resist scum and to increase wettability for laminating and legend adhesion. After the treatment is completed, the chamber door 15 is opened to reveal the access opening 18, the rack 35 carrying the processed panels 40 is removed from the vacuum chamber 14, and the processed panels 40 are offloaded from the rack 35 and routed to another processing stage.

References herein to terms such as "vertical", "horizontal", etc. are made by way of example, and not by way of limitation, to establish a frame of reference. It is understood various other frames of reference may be employed without departing from the spirit and scope of the invention. Although the electrodes 24 are referred to as being vertically oriented, a person having ordinary skill in the art will appreciate that the electrodes 24 may have a non-vertical orientation.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicants' general inventive concept. The scope of the invention itself should only be defined by the appended claims.

What is claimed is:

1. A plasma treatment system comprising:
a vacuum chamber;
a power buss;
a ground buss;
a positive phase secondary electrode buss;

a negative phase secondary electrode buss;
a positive phase primary electrode buss;
a negative phase primary electrode buss;
a plurality of isolation transformers, each of said isolation transformers including a primary winding and a secondary winding, said primary winding having a first end coupled to said power buss and a second end coupled to said ground buss, said first ends of said primary windings coupled to said power buss in parallel, said second ends of said primary windings coupled to said ground buss in parallel, and said secondary winding having a first end coupled to said positive phase secondary electrode buss and a second end coupled to said negative phase secondary electrode buss;
a first plurality of capacitors coupling said positive phase secondary electrode buss to said positive phase primary electrode buss;
a second plurality of capacitors coupling said negative phase secondary electrode buss to said negative phase primary electrode buss; and
a plurality of electrodes in said vacuum chamber, each of said electrodes coupled with said positive phase primary electrode buss or with said negative phase primary electrode buss.

2. The plasma treatment system of claim 1 further comprising:
a first load coil coupling said positive phase primary electrode buss to ground; and
a second load coil coupling said negative phase primary electrode buss to ground.

3. The plasma treatment system of claim 2 wherein said positive phase primary electrode buss and said negative phase primary electrode buss have a parallel arrangement, said positive phase primary electrode buss has a peripheral end coupled to said first load coil, and said negative phase primary electrode buss has a peripheral end coupled to said second load coil.

4. The plasma treatment system of claim 2 further comprising:
a grounded enclosure housing said power buss, said ground buss, said positive phase secondary electrode buss, said negative phase secondary electrode buss, said positive phase primary electrode buss, said negative phase primary electrode buss, said plurality of isolation transformers, said first plurality of capacitors, said second plurality of capacitors, said first load coil, and said second load coil,
wherein said first load coil and said second load coil are electrically coupled to ground by said enclosure.

5. The plasma treatment system of claim 2 further comprising:
an RF input feedthrough coupled to said power buss near a center feed-point having an RF impedance,
wherein a capacitance of said capacitors and an inductance of said load inductors are selected to reduce an impedance mismatch between said center feed-point and said RF input feedthrough.

6. The plasma treatment system of claim 1 wherein said first ends of said primary windings are coupled to said power buss at regularly spaced intervals, said second ends of said primary windings are coupled to said ground buss at regularly spaced intervals, said first ends of said secondary windings are coupled to said positive phase secondary electrode buss at regularly spaced intervals, and said second ends of said secondary windings are coupled to said negative phase secondary electrode buss at regularly spaced intervals.

7. The plasma treatment system of claim 1 further comprising:
a plurality of feedthroughs configured to couple each of said electrodes with said positive phase primary electrode buss or with said negative phase primary electrode buss.

8. The plasma treatment system of claim 7 further comprising:
a plurality of brackets configured to electrically couple said feedthroughs to one of either said positive phase primary electrode buss or said negative phase primary electrode buss in an alternating sequence.

9. The plasma treatment system of claim 7 wherein said feedthroughs are further configured to provide a sealed coolant path to said electrodes.

10. The plasma treatment system of claim 7 wherein said electrodes have a juxtaposed arrangement to define a plurality of localized process chambers in said vacuum chamber, each of said electrodes has an outer perimeter, and each of said feedthroughs projects outwardly from said outer perimeter of one of said electrodes.

11. The plasma treatment system of claim 1 further comprising:
a positive phase chamber electrode buss in said vacuum chamber, said positive phase chamber electrode buss coupled to said electrodes that are coupled to said positive phase primary electrode buss; and
a negative phase chamber electrode buss in said vacuum chamber, said negative phase chamber electrode buss coupled to said electrodes that are coupled to said negative phase primary electrode buss.

* * * * *